United States Patent
Rowell et al.

(10) Patent No.: US 11,762,018 B2
(45) Date of Patent: Sep. 19, 2023

(54) MEASUREMENT SYSTEM AND METHOD FOR TESTING A DEVICE UNDER TEST

(71) Applicant: Rohde & Schwarz GmbH & Co. KG, Munich (DE)

(72) Inventors: Corbett Rowell, Munich (DE); Vincent Abadie, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 936 days.

(21) Appl. No.: 16/298,806

(22) Filed: Mar. 11, 2019

(65) Prior Publication Data
US 2019/0302184 A1    Oct. 3, 2019

(30) Foreign Application Priority Data

Mar. 28, 2018    (EP) .................................... 18164742

(51) Int. Cl.
| | | |
|---|---|---|
| G01R 31/319 | (2006.01) | |
| G01R 31/28 | (2006.01) | |
| H04B 17/10 | (2015.01) | |
| G01R 29/08 | (2006.01) | |
| H01Q 3/16 | (2006.01) | |
| G01R 29/10 | (2006.01) | |
| H01Q 19/13 | (2006.01) | |

(52) U.S. Cl.
CPC ... *G01R 31/31903* (2013.01); *G01R 29/0821* (2013.01); *G01R 31/2813* (2013.01); *H01Q 3/16* (2013.01); *H04B 17/101* (2015.01); *G01R 29/105* (2013.01); *H01Q 19/132* (2013.01)

(58) Field of Classification Search
CPC .......................... G01R 29/105; G01R 29/0821
See application file for complete search history.

(56) References Cited

U.S. PATENT DOCUMENTS

| | | | | |
|---|---|---|---|---|
| 6,031,502 A | * | 2/2000 | Ramanujam | H01Q 3/16 343/781 P |
| 7,791,355 B1 | * | 9/2010 | Esher | G01N 22/00 324/637 |
| 7,876,276 B1 | * | 1/2011 | Zaman | H01Q 3/08 343/703 |

(Continued)

FOREIGN PATENT DOCUMENTS

| | | |
|---|---|---|
| CN | 107566052 A | 1/2018 |
| EP | 3182144 A1 | 6/2017 |

*Primary Examiner* — Michael J Dalbo
(74) *Attorney, Agent, or Firm* — CHRISTENSEN O'CONNOR JOHNSON KINDNESS PLLC

(57) ABSTRACT

A measurement system for testing a device under test is described, with at least two antennas, at least two reflectors, a signal generation and/or analysis equipment and a test location. Each of the antennas is assigned to a corresponding reflector. Each of the antennas is configured to transmit/receive an electromagnetic signal so that a beam path is provided between the respective antenna and the test location. The electromagnetic signal is reflected by the respective reflector so that the electromagnetic signal corresponds to a planar wave. The beam paths have different angular orientations that are adjustable. At least one antenna and the corresponding reflector are coupled with each other so that an integrated beam path adjustment unit is established including at least one antenna and the corresponding reflector. Further, a testing method is described.

12 Claims, 2 Drawing Sheets

(56) References Cited

U.S. PATENT DOCUMENTS

| | | | | |
|---|---|---|---|---|
| 2008/0129615 | A1* | 6/2008 | Breit | H04W 56/00 |
| | | | | 343/703 |
| 2010/0285753 | A1* | 11/2010 | Foegelle | H04B 17/21 |
| | | | | 455/67.12 |
| 2012/0100813 | A1* | 4/2012 | Mow | H04B 17/16 |
| | | | | 455/67.12 |
| 2014/0028514 | A1* | 1/2014 | Cuchanski | H01Q 3/247 |
| | | | | 343/761 |
| 2014/0256373 | A1* | 9/2014 | Hernandez | H04B 17/12 |
| | | | | 455/509 |
| 2017/0115334 | A1* | 4/2017 | Symes | G01M 7/022 |
| 2017/0242061 | A1 | 8/2017 | Göttl et al. | |
| 2017/0288769 | A1* | 10/2017 | Miller | H04B 7/18515 |
| 2018/0287721 | A1* | 10/2018 | Vikstedt | G01R 29/0878 |
| 2019/0393968 | A1* | 12/2019 | Ioffe | H01Q 3/267 |

\* cited by examiner

MEASUREMENT SYSTEM AND METHOD FOR TESTING A DEVICE UNDER TEST

FIELD OF THE DISCLOSURE

Embodiments of the present disclosure relate to a measurement system for testing a device under test as well as a method for testing a device under test.

BACKGROUND

In the state of the art, measurement systems are known that can be used for testing devices under test such as mobile communication devices with regard to multiple-input multiple-output (MIMO) characteristics as well as radio resource management (RRM) characteristics.

Usually, the devices under test are placed in a shielded room or a shielded chamber which is also called multiple probe anechoic chamber (MPAC). The MPAC may comprise hundreds of antennas for testing the respective characteristics of the device under test, for instance the far-field characteristics of the device under test which correspond to the characteristics defining the performance of the device under test. The antennas used may correspond to so-called plane wave converters (PWCs) so that the far-field characteristics of the device under test can be tested appropriately as plane waves are used for testing purposes that correspond to the electromagnetic waves in the far-field.

Alternatively, far-field chambers are used for testing the far-field characteristics of the device under test. However, the space required by those measurement systems is high.

For testing the angular performance characteristics of the device under test such as downlink and/or uplink characteristics, hundreds of antennas are required for performing the respective measurements. These tests are typically required for measuring the MIMO and/or RRM characteristics of a device under test under realistic conditions. However, the costs for measuring the respective (far-field) performance characteristics, in particular the angular behavior, are high due to the number of antennas.

SUMMARY

Thus, there is a need for a possibility to test a device under test with regard to the MIMO and/or RRM characteristics in a cheaper and more compact manner.

Embodiments of the present disclosure provide a measurement system for testing a device under test. In some embodiments, the system comprises at least two antennas, at least two reflectors, a signal generation and/or analysis equipment, and a test location for the device under test, wherein each of the at least two antennas is assigned to a corresponding reflector, wherein each of the at least two antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein the beam paths have different angular orientations that are adjustable, and wherein at least one antenna and the corresponding reflector are coupled with each other so that an integrated beam path adjustment unit is established including at least one antenna and the corresponding reflector.

Further, the embodiments of the present disclosure provide a method for testing a device under test placed on a test location by using a measurement system comprising a signal generation and/or analysis equipment and at least one integrated beam path adjustment unit including an antenna and a reflector coupled with the respective antenna, with the following steps:

Adjusting the beam path adjustment unit with respect to the device under test so that a beam path is established between the device under test and the respective antenna of the beam path adjustment unit having a defined angular orientation, Generating an electromagnetic signal by the device under test and/or the signal generation equipment, and Receiving the electromagnetic signal generated via the signal analysis equipment and/or the device under test.

The present disclosure is based on the finding that the respective measurements, namely multiple-input multiple-output (MIMO) and/or radio resource management (RRM) measurements, can be done in a more efficient manner by using a measurement system that has at least one integrated beam path adjustment unit that includes one antenna and a corresponding reflector that deflects the electromagnetic signal exchanged between the device under test and the corresponding antenna appropriately. The reflector ensures that the far-field characteristics of the device under test, for instance the respective receiving and/or transmitting characteristics, can be investigated by the measurement system even though the measurement system is more compact than measurement systems known in the prior art for testing the far-field characteristics of the device under test. This can be ensured since the electromagnetic signal generated is reflected by the reflector such that a planar wave is provided that corresponds to an electromagnetic wave in the far-field.

Due to the at least two antennas, for instance feed or measurement antennas, the respective characteristics of the device under test with regard to the MIMO and/or RRM characteristics can be tested since two different base stations can be simulated for testing hand-over scenarios. Furthermore, multiple layer communications, also called multi-layered communication, as used by MIMO applications can be tested appropriately.

Generally, the integrated beam path adjustment unit ensures that the antenna and the corresponding reflector may have a predetermined relationship between each other so that certain settings can be set easily. This is ensured as the antenna and the corresponding reflector are (mechanically) coupled with each other ensuring a predefined spatial relationship that may be adjusted if desired. In some embodiments, the integrated beam path adjustment unit is a single unit.

Thus, the respective antenna and the corresponding reflector are mounted simultaneously when the integrated beam path adjustment unit is mounted.

Accordingly, the setup for testing the device under test is simplified so that the measurements can be done faster and in a more cost-efficient manner since the overall efforts related to the testing of the device under test are reduced, for example providing different test setups. In other words, the measurement system, for example the integrated beam path adjustment unit, is easy to use so that the user of the measurement system is enabled to carry out the respective measurements in a time-efficient and, therefore, cost-efficient manner.

The respective reflectors can have an appropriate shape in order to ensure that plane waves are provided when the respective electromagnetic signals are reflected. Hence, shaped reflectors are provided. The reflectors can be used to focus the electromagnetic signal(s) deflected appropriately.

The signal generation and/or analysis equipment may be established by signal processing equipment that may comprise a signal generation unit and/or a signal analysis unit. Thus, the signal processing equipment may be at least one of a signal generation equipment and a signal analysis equipment.

The integrated beam path adjustment unit may be adjusted so that the beam path related to the integrated beam path adjustment unit has a different angular orientation than the beam path provided by another antenna, for instance a (fixed) antenna that may be assigned to a (fixed) reflector.

According to an aspect, each of the reflectors is located in the corresponding beam path, wherein each of the reflectors is configured to generate and/or collimate a planar wave. Thus, the reflectors ensure that the far-field characteristics of the device under test can be measured by the measurement system even though the measurement system does not require the space that is typically required by a measurement system for testing the far-field characteristics of a device under test. The (e.g., appropriately shaped) reflector ensures that a planar wave is generated and/or collimated which corresponds to an electromagnetic wave in the far-field. Thus, the reflector located within the corresponding beam path adapts or rather converts the electromagnetic signal so that the far-field characteristics are obtainable.

According to another aspect, the beam path adjustment unit comprises a rotational adjustment member for rotational movement of the reflector and/or the antenna. Accordingly, the angular orientation of the respective beam path can be inter alia adjusted by the rotational movement of the beam path adjustment unit, for example the respective component assigned to the rotational adjustment member. The rotational adjustment member may be assigned to one component of the integrated beam path adjustment unit, for instance the reflector or the antenna, so that only this component can be rotated appropriately. However, the rotational adjustment member may also be assigned to both components simultaneously. Alternatively, two rotational adjustment members for both components may be provided. For instance, the at least one rotational adjustment member is established by a gimbal or a joint.

Moreover, the beam path adjustment unit may comprise a linear adjustment member for adjusting the linear position of the reflector and/or the antenna. The linear adjustment member may be used to adjust the relative (linear or rather axial) position of the reflector and/or the antenna with respect to the test location. Hence, the relative position of one respective component of the integrated beam path adjustment unit with respect to the device under test located at the test location can be adjusted appropriately by the linear adjustment member. Accordingly, the linear adjustment member of the integrated beam path adjustment unit can inter alia be used to adjust the angular orientation of the respective beam path. The linear adjustment member may also be assigned to both components simultaneously. Alternatively, two linear adjustment members for both components may be provided.

The linear adjustment member may also be used to adjust the relative (linear or rather axial) position of the reflector and/or the antenna with respect to each other.

The linear adjustment member may be established by a linear rail along which the respective component of the integrated beam path adjustment unit, namely the antenna and/or the reflector, can be displaced in a linear manner.

Generally, the linear adjustment member, for instance the linear rail, and the rotational adjustment member, for instance the gimbal, ensure that a linear and rotational movement of at least one component of the integrated beam path adjustment unit is possible with respect to the device under test. Accordingly, the beam path established between the antenna and the device under test can be adapted appropriately with regard to its angular orientation.

For instance, two beam path adjustment units are provided, wherein the linear adjustment members of both beam path adjustment units intersect each other in a plan view, for example in the area of the test location. The linear adjustment members may be assigned to different planes so that the linear adjustment members intersect each other in a plan view on the measurement system. In some embodiments, the respective linear adjustment members are stacked on each other at least partly. For instance, the linear adjustment members are connected with each other in the intersecting area via a joint or a bearing.

The intersection of the linear adjustment members may correspond to the area of the test location, namely the device under test, so that the device under test corresponds to a fixed-point for both integrated beam path adjustment units. Hence, the linear movement of at least one component of the respective integrated beam path adjustment unit is done with respect to the device under test being the fixed-point.

According to another aspect, two beam path adjustment units are provided, wherein both beam path adjustment units can be moved about the same axis independently from each other. Hence, both beam path adjustment units can be swiveled about the same axis corresponding to a rotational axis. In other words, both beam path adjustment units can be moved in a circular manner with respect to the same axis. The axis may correspond to the center of the test location on which the device under test is placed for testing purposes.

The independent movement of the at least two beam path adjustment units, for example the independent movement of the linear adjustment members of the respective beam path adjustment units, can be ensured by a joint, a bearing and/or any other suitable member ensuring a relative movement. Both integrated beam path adjustment units may be connected with each other via the joint, the bearing or the other suitable member used.

The measurement system, for example the integrated beam path adjustment units as well as the test location, may be formed in an integrated manner since the integrated beam path adjustment units are connected with each other via their linear adjustment members.

The reflectors may correspond to a respective first end of the linear adjustment members whereas the axis and/or the test location for the device under test is assigned to a respective second end of the linear adjustment members wherein the first and the second ends being opposite to each other.

Generally, the reflector splits the respective beam path into two parts, namely a first part corresponding to the antenna and a second part corresponding to the test location. Thus, the first part of the respective beam path is assigned to the portion between the reflector and the antenna whereas the second part of the respective beam path is assigned to the portion between the reflector and the device under test and/or the test location.

Another aspect provides that the beam path adjustment unit comprises a height adjustment member for adjusting the height of the reflector and/or the antenna. Therefore, the angular orientation of the beam path established can be adjusted further. The height of the antenna can be adjusted appropriately in order to account for a different reflector height with regard to the device under test placed on the test location. The reflector can be adjusted in its height with regard to a different device under test to be tested.

Furthermore, each reflector may be designed such that it can account for different heights of the device under test. Thus, the reflector itself can be used for different devices under test with regard to their respective heights. However, the height of the associated antenna can be adjusted appropriately.

Moreover, a remote radio head can be assigned to the beam path adjustment unit. For instance, the remote radio head, also called remote radio unit, is placed under the respective linear adjustment member so that the remote radio head is located close to the antenna. This ensures that path losses are reduced that might occur if the remote radio head is located at a certain distance with respect to the antenna. In general, the remote radio head corresponds to a transceiver that connects to a radio control unit via an interface. The radio control unit may be provided by the signal generation and/or analysis equipment. For instance, the remote radio head comprises the respective circuitry, the respective converters (A/D converters and/or D/A converters) and/or the respective converters (up- and/or down-converters).

Furthermore, the angular orientation of the test location may be adjustable. In other words, the test location comprises a rotational axis about which the test location (and the device under test) can be rotated.

The device under test itself may be rotated about the rotational axis so that different angular orientations of the beam path can be set due to a movement of the device under test, for example a rotational movement of the device under test.

The rotational axis about which the device under test can be rotated may coincidence with the axis about which the linear adjustment members can be rotated or rather swiveled.

As already mentioned, the linear adjustment members may be stacked on each other wherein the test location for the device under test is assigned to the stack. Hence, a common rotational axis may be provided for the beam path adjustment units, for example the linear adjustment members, and the device under test.

According to another aspect, the measurement system comprises a shielded space encompassing the at least two antennas, the at least two reflectors and/or the test location. Thus, interfering signals disturbing the testing of the device under test can be shielded appropriately so that it is ensured that the test results are reliable.

For instance, the integrated beam path adjustment unit is located at a wall of the shielded space, for example a side wall, a bottom wall or a ceiling. Thus, the respective integrated beam path adjustment unit, namely the antenna as well as the corresponding reflector, are attached to a wall of the shielded space. For instance, the integrated beam path adjustment unit can be mounted on the wall by a certain fixing member such as a screw, a clip or any other suitable fixing member.

Further, the integrated beam path adjustment unit may be placed on a table within the shielded space, for instance on an optical table.

According to an embodiment, both antennas are configured to process separate data streams for spatial multiple-input multiple-output testing and/or to process the same data streams for radio resource management testing. Therefore, base station hand-over scenarios, for example the characteristics of the device under test related thereto, can be tested due to the antennas assigned to the respective beam paths with different angular orientations. A hand-over testing scenario at fixed angles can be defined for testing the device under test, for instance fixed angles at 30°, 60° and/or 90°.

Moreover, the antennas may be dual-polarized antennas. The two dual-polarized antennas enable four-layer multiple-input multiple-output testing of the device under test.

For instance, the dual-polarized antennas may be moved at different offset angles with respect to the device under test so that the respective measurements can be carried out for testing the angular behavior of the device under test.

According to an aspect, a measurement system as mentioned above is used when carrying out the method for testing a device under test. Thus, the advantages mentioned above also apply in a similar manner to the method.

The measurement system for testing the device under test corresponds, in some embodiments, to a (movable) compact antenna test range (CATR) system that can be used for multiple-input multiple-output testing as well as radio resource management testing of the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
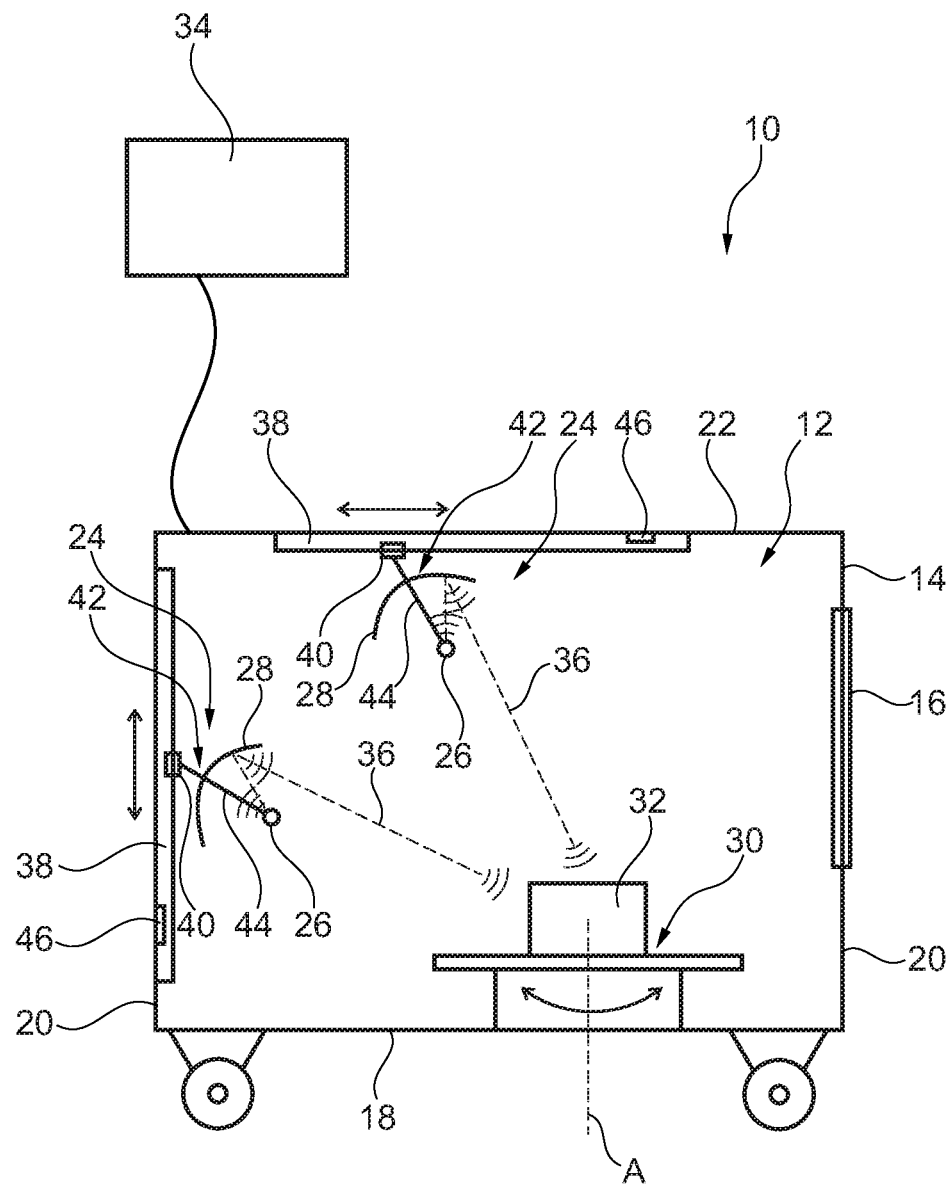
FIG. 1 schematically shows a representative example of a measurement system according to an embodiment of the present disclosure.

In FIG. 1, a measurement system 10 is shown that comprises a shielded space 12 provided by a moveable device 14 that defines a chamber which can be accessed via a sealable opening 16. Generally, the shielded space 12 is limited by a bottom wall 18, several side walls 20, for example four side walls 20, as well as a ceiling 22.

As shown in FIG. 1, the measurement system 10 further comprises two integrated beam path adjustment units 24 that are located at one of the side walls 20 and the ceiling 22, respectively. As will be described later, the integrated beam path adjustment units 24 can be moved along the side wall 20 and ceiling 22, respectively. Of course, the integrated beam path adjustment units 24 may alternatively or additionally be located at any other wall of the chamber or rather the shielded space 12.

Each of the integrated beam path adjustment units 24 comprises one antenna 26 as well as a reflector 28 that is assigned to the antenna 26. The antenna 26 and the reflector 28 are located with respect to each other such that signals transmitted by the antenna 26 are deflected by the corresponding reflector 28 as schematically illustrated in FIG. 1 The antenna 26 and the corresponding reflector 28 assigned to the respective antenna 26 are (mechanically) coupled with each other so that the integrated beam path adjustment units 24 is a single unit which can be mounted on the respective wall 18 to 22 of the shielded space 12. When the integrated beam path adjustment unit 24 is mounted on the respective wall 18 to 22 of the shielded space 12, both components, namely the antenna 26 and the reflector 28, are mounted on the respective wall 18 to 22 of the shielded space 12 simultaneously.

The measurement system 10 also comprises a test location 30 on which a device under test 32 is placed that can be tested by the measurement system 10. The device under test 32 may be a mobile communication device, for instance a mobile phone, a tablet or any other suitable mobile end device.

The measurement system 10 further comprises a signal generation and/or analysis equipment 34 that is assigned to the integrated beam path adjustment units 24 and/or the device under test 32. The signal generation and/or analysis equipment 34 may be connected to the moveable device 14 via an interface, for instance an electric interface.

Generally, the measurement system 10 is configured to test the transmission characteristics of the device under test 32 and/or the receiving characteristics of the device under test 32. Thus, the signal generation and/or analysis equipment 34 can be configured to generate an electromagnetic signal that is transmitted via the integrated beam path adjustment unit 24 towards the device under test 32, for example the respective antennas 26, in order to test the receiving characteristics of the device under test 32.

Alternatively or additionally, the signal generation and/or analysis equipment 34 is configured to analyze electromagnetic signals received via the integrated beam path adjustment units 24, for example the respective antennas 26, which have been transmitted by the device under test 32 so that the transmission characteristics of the device under test 32 can be measured appropriately.

It should be understood that the signal generation and/or analysis equipment 34 can be implemented in hardware or software or a combination of hardware and software. In some embodiments, the signal generation and/or analysis equipment 34 includes circuitry (e.g., analog, digital, combinations thereof) configured to carry out the functionality set forth herein.

In some embodiments, a beam path 36 is provided between each beam path adjustment unit 24, for example the respective antenna 26, and the device under test 32 placed on the test location 30. As mentioned above, the beam paths 36 may originate from the integrated beam path adjustment units 24, for example the respective antennas 26, as illustrated in FIG. 1 schematically or they may originate from the device under test 32.

Irrespective of the origin of the electromagnetic signals, the signals are reflected by the reflector 28 towards the device under test 32 or rather the antenna 26 associated to the respective reflector 28. Hence, the reflector 28 is located in the beam path 36.

Since the integrated beam path adjustment units 24 can be moved in a linear manner (as indicated by the respective arrows), the angular orientation of the respective beam path 36 with regard to the device under test 32 can be adapted. The linear movement is established by a linear adjustment member 38 that ensures that the antenna 26 and the reflector 28 can be moved in a linear manner along the respective wall. In the shown embodiment, the linear adjustment member 38 corresponds to a linear rail that is attached to the respective wall of the shielded space 12.

The antenna 26 and the reflector 28 both are assigned to the linear adjustment member 38 so that they can be moved with respect to the device under test 32. Hence, both components of the integrated beam path adjustment unit 24, namely the antenna 26 and the reflector 28, can be moved along the respective wall in a linear manner simultaneously.

In addition to this linear movement, the integrated beam path adjustment unit 24 comprises a rotational adjustment member 40 that ensures a rotational movement of the reflector 28 and/or the antenna 26. Hence, the angular orientation of the integrated beam path adjustment unit 24 can be adapted appropriately by adjusting the rotational adjustment member 40 in a desired manner. For instance, the rotational adjustment member 40 is established by a gimbal.

In the shown embodiment, the rotational adjustment member 40 is assigned to the linear adjustment member 38 so that both components of the integrated beam path adjustment unit 24, namely the antenna 26 and the reflector 28, can be rotated appropriately.

According to another embodiment, the rotational adjustment member 40 may be located between the antenna 26 and the reflector 28 so that the antenna 26 can be rotated with respect to the corresponding reflector 28. Alternatively, the reflector 28 can be rotated with respect to the corresponding antenna 26.

Generally, the rotational and/or linear movement of the integrated beam path adjustment unit 24 ensures that the angular orientation of the respective beam path 36 can be adapted appropriately. The angular orientation may correspond to the angles theta and phi in the spherical coordinate system.

In the shown embodiment of FIG. 1, the test location 30 is also provided in a movable manner as the angular orientation of the test location 30 and, therefore, the angular orientation of the device under test 32 placed on the test location 30 can be adjusted appropriately. This is indicated by the arrow which illustrates the rotational movement of the table defining the test location 30 about the rotational axis A.

Therefore, the angular orientation of the beam path 36 can be adapted by adapting the relative position of the beam path adjustment unit 24 and/or the device under test 32 itself.

In addition, the measurement system 10 may have a height adjustment member 42 that is assigned to the respective integrated beam path adjustment unit 24. For instance, the height relates to the distance between the antenna 26 and the corresponding reflector 28 in the shown embodiment so that this distance can be adapted appropriately.

In the shown embodiment, the reflector 28 may be displaced along a connecting member 44 via which the antenna 26 is connected to the linear adjustment member 38 and/or the rotational adjustment member 40. Hence, the reflector 28 can be displaced with respect to the antenna 26 being fixed at the end of that connecting member 44. The connecting member 44 also provides the mechanical coupling between the reflector 28 and the antenna 26.

The measurement system 10, for example each integrated beam path adjustment units 24, may comprise a remote radio head 46 that is assigned to the respective antenna(s) 26. For instance, the remote radio head 46 is located under the respective linear adjustment member 38 so that it is located close to the respective antenna 26. Hence, the path losses can be reduced compared to the ones that would occur if the remote radio head 46 would be located at a certain distance with respect to the antenna 26. Accordingly, the remote radio head 46 is assigned to the corresponding integrated beam path adjustment unit 24.

As shown in FIG. 1, the respective reflectors 28 are shaped, for example curved or rather arcuate, so that the electromagnetic signals deflected by the reflectors 28 are converted into planar waves that correspond to the electromagnetic waves in the far-field. In some embodiments, the reflectors 28 generate and/or collimate planar waves.

The far-field characteristics of the device under test 32 can be measured within the shielded space 12 by the measurement system 10 even though the distance between the device under test 32 and the respective antenna 26 is small in comparison with the Fraunhofer distance. Thus, a compact measurement system 10 for testing the far-field characteristics of the device under test 32 is provided.

The antennas 26 can be established by dual-polarized antennas so that the at least two antennas 26 can be used for four-layer multiple-input multiple-output (MIMO) testing of the device under test 32. Accordingly, the measurement system 10, for example the antennas 26, is configured to process separate data streams for spatial multiple-input multiple-output testing of the device under test 32.

Furthermore, the (dual polarized) antennas 26 can be used for radio resource management (RRM) testing of the device under test 32, for instance testing of hand-over scenarios of the device under test 32 between two base stations simulated by the (dual polarized) antennas 26. Accordingly, the measurement system 10, for example the antennas 26, is configured to process the same data streams.

In some embodiments, the measurement system 10 comprises at least two antennas 26, two corresponding reflectors 28, the signal generation and/or analysis equipment 34 as well as the test location for the device under test 32. As shown in FIG. 1, at least the two antennas 26, the reflectors 28 as well as the test location 30 are assigned to the shielded space 12 so that the shielded space 12 encompasses these units of the measurement system 10 ensuring that interfering signals are shielded that may disturb the testing of the device under test 32.

Figure 2:
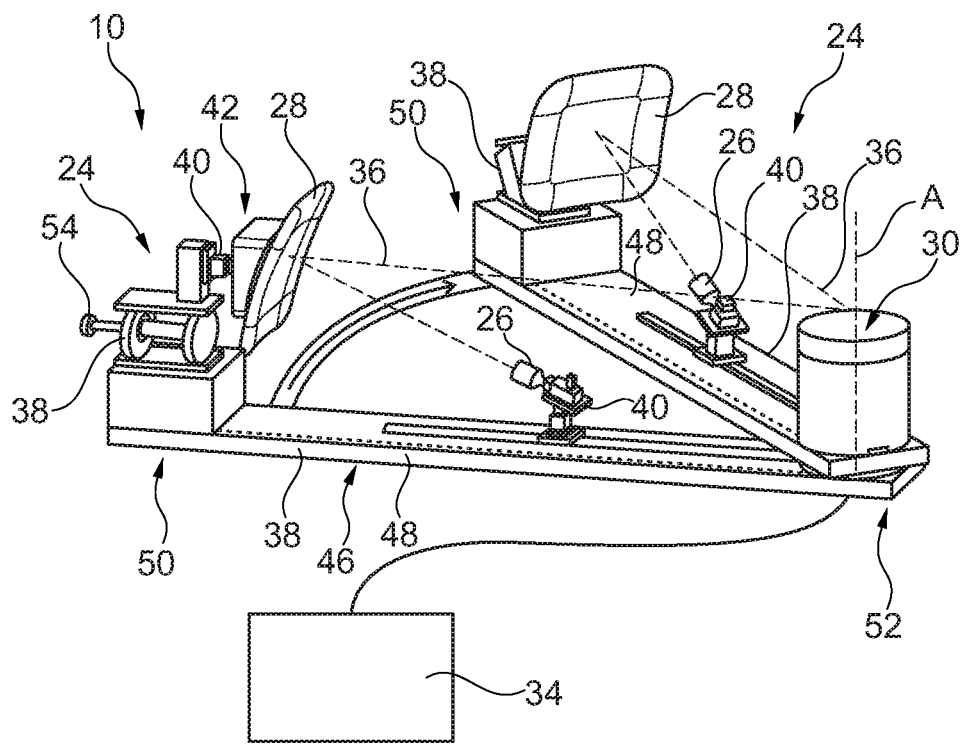
FIG. 2 shows a perspective view of a representative example of a measurement system according to an embodiment of the present disclosure.
Figure 3:
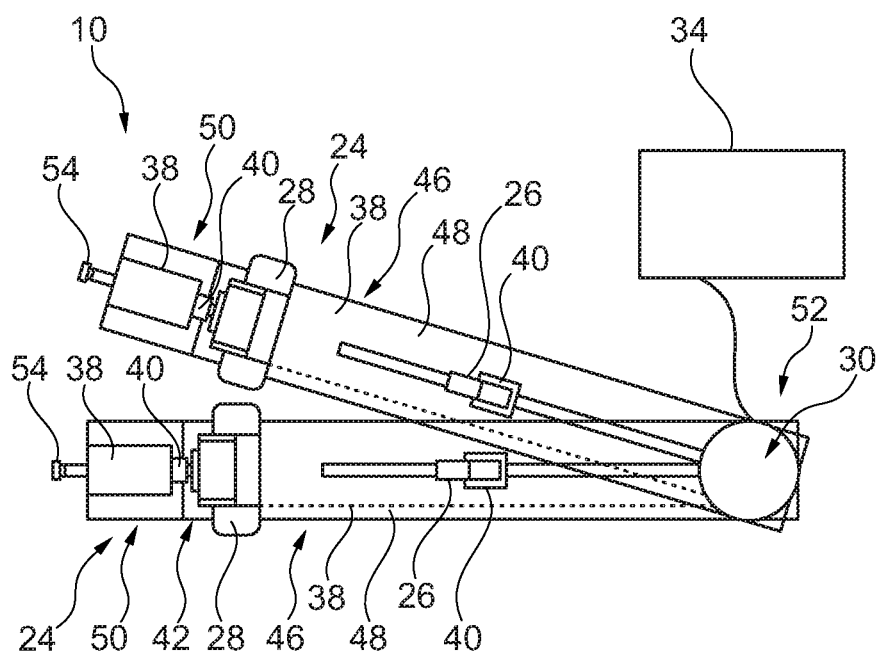
FIG. 3 shows a plan view on the measurement system of FIG. 2.

In FIGS. 2 and 3, another embodiment of the measurement system 10 for testing a device under test 32 is shown. In this embodiment, each integrated beam path adjustment unit 24 comprises a linear adjustment member 38 that is assigned to the antenna 26 wherein the linear adjustment member 38 is established by a linear rail 48 along which the respective antenna 26 can be moved linearly at least partly.

Hence, the linear rails 48 ensure that the respective antenna 26 mounted thereon, can be moved in a linear manner with respect to the corresponding reflector 28 that is also mounted on the respective linear rail 48 at a first end 50.

The linear rails 48 of both integrated beam path adjustment units 24 intersect each other at a certain point that relates to an area of the test location 30.

The area of the test location 30 is assigned to a second end 52 of the respective linear rail 48. The second ends 52 of the linear rails 48 are opposite to the first ends 50. Hence, the reflectors 28 are assigned to one end of the linear rails 48 whereas the test location 30 is assigned to the opposite ends of the linear rails 48.

In some embodiments, both linear rails 48 intersect each other in an axis A that corresponds to the center axis of the test location 30. This axis A may correspond to a rotational axis for the device under test 32 about which the device under test 32 can be rotated if desired.

Moreover, both beam path adjustment units 24 can be rotated independently from each other about this axis A.

Thus, a rotational movement of the beam path adjustment units 24 with respect to the device under test 32 is also ensured.

The beam path adjustment units 24, for example their linear rails 48, can be connected with each other by a joint and/or a bearing in the respective area assigned to the axis A, wherein both linear rails 48 are located in different planes so that they can move relative to each other and independently from each other. In some embodiments, the linear rails 48 correspond to clock arms as they can move in a rotational manner independently of each other about the same axis, namely the rotational axis A.

It is also shown that a linear adjustment member 38 is assigned to each reflector 28 so that the (linear) position of the reflector 28 with respect to the antenna 26 can also be adapted appropriately. The linear adjustment member 38 assigned to the reflector 28 may comprise an adjusting screw 54 for fine tuning the respective position of the reflector 28 with respect to the antenna 26.

Moreover, rotational adjustment members 40 are assigned to each reflector 28 and each antenna 26 so that the antennas 26 and/or reflectors 28 can be rotated appropriately. For instance, the rotational adjustment members 40 are established by gimbals, joints or any other suitable members allowing a rotational movement.

In addition, the integrated beam path adjustment units 24 each comprise a height adjustment member 42 so that the height of the reflector 28 can be set appropriately. In the shown embodiment, the height is substantially perpendicular to the linear direction which is assigned to the distance between the antenna 26 and the reflector 28 of the same integrated beam path adjustment units 24.

The measurement system 10, for example the respective beam path adjustment units 24, may also comprise the remote radio head(s) 46 being assigned to the linear rails 48, for example located under the linear rails 48. Accordingly, the remote radio heads 46 are located close to the respective antennas 26 reducing path losses between the antennas 26 and the remote radio heads 46.

As already mentioned, the beam path 36 provided by each beam path adjustment unit 24 comprises two parts, namely the first part established between the reflector 28 and the antenna 26 as well as the second part established between the reflector 28 and the device under test 32.

Thus, the electromagnetic signals transmitted by the antenna 26 are deflected or rather reflected by the reflector 28 towards the device under test 32. In a similar manner, the electromagnetic signals transmitted by the device under test 32 are deflected or rather reflected by the reflector 28 towards the antenna 26.

The measurement system 10 shown in FIGS. 2 and 3 can be located on a table, for instance an optical table, within a shielded space which is not shown in the respective FIGURES. Both embodiments shown can be used for testing the device under test 32 that has been placed on the test location 30.

Depending on the testing scenario, the angular orientations of the adjustment units 24 are adjusted with respect to the device under test 32 so that two beam paths 36 are established between the device under test 32 and the respective antenna 26. The beam paths 36 established may have different angular orientations.

Once the angular orientations are set, at least one electromagnetic signal is generated by the signal generation equipment 34 (for testing the receiving characteristics of the device under test 32) or by the device under test 32 (for testing the transmission characteristics of the device under test 32). The respective electromagnetic signal generated is received via the device under test 32 or rather the signal analysis equipment 34 depending on the testing scenario. Then, the electromagnetic signal received is analyzed appropriately. In case of the device under test 32 receiving the electromagnetic signal generated, the analysis can be done by the signal analysis equipment 34 which may be connected to the device under test 32.

The method can also be carried out by using only one integrated beam path adjustment unit 24 for adjusting the angular orientation of the respective beam path 36 related to the integrated beam path adjustment unit 24. For instance, another antenna 26 (and a reflector 28 associated thereto) is provided that establishes a fixed beam path which angular orientation cannot be adapted.

Nevertheless, the MIMO and RRM testing can be done since at least one beam path 36, namely the one associated to the integrated beam path adjustment unit 24, can be adapted for testing purposes, for example the angular orientation of this beam path 36.

In addition, the measurement system 10 may also comprise more than two integrated beam path adjustment units 24 so that more than two base stations can be simulated for testing purposes.

Accordingly, a compact measurement system 10 is provided that ensures over-the-air (OTA) measurements of the device under test 32 in a cheap and efficient manner.

Furthermore, two compact antenna test range quiet zones can be generated within the shielded space 12 due to the two antennas 26.

Generally, at least two far-field sources, namely the antennas 26 (in combination with the corresponding reflectors 28) are provided so that hand-over-scenarios as well as multi-layer MIMO testing of the device under test 32 can be carried out appropriately.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test, comprising at least two antennas, at least two reflectors, a signal generation and/or analysis equipment, and a test location for the device under test, wherein each of the at least two antennas is assigned to a corresponding reflector of the at least two reflectors, wherein each of the at least two antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein the beam paths have different angular orientations that are adjustable, and wherein at least one antenna and the corresponding reflector of the at least two reflectors are coupled with each other so that an integrated beam path adjustment unit is established including the at least one antenna and the corresponding reflector of the at least two reflectors, wherein the beam path adjustment unit comprises a rotational adjustment member for rotational movement of the reflector, wherein the beam path adjustment unit comprises a linear adjustment member for adjusting the linear position of the antenna with respect to the reflector, wherein the linear adjustment member is established by a linear rail along which the antenna can be displaced in a linear manner, and wherein the reflector is also mounted on the respective linear rail, wherein first and second beam path adjustment units are provided, wherein the linear adjustment members of the first and second beam path adjustment units intersect each other at an axis in the area of the test location at which the device under test is positioned during testing, and wherein the first and second beam path adjustment units are moveable about the same axis independently from each other.

2. The measurement system according to claim 1, wherein each of the reflectors is located in a corresponding beam path and wherein each of the reflectors is configured to generate and/or collimate a planar wave.

3. The measurement system according to claim 1, wherein the beam path adjustment unit comprises a linear adjustment member for adjusting the linear position of the reflector.

4. The measurement system according to claim 1, wherein the beam path adjustment unit comprises a height adjustment member for adjusting the height of the reflector and/or the antenna.

5. The measurement system according to claim 1, wherein a remote radio head is assigned to the beam path adjustment unit.

6. The measurement system according to claim 1, wherein the angular orientation of the test location is adjustable.

7. The measurement system according to claim 1, wherein the measurement system comprises a shielded space encompassing the at least two antennas, the at least two reflectors and/or the test location.

8. The measurement system according to claim 1, wherein both antennas are configured to process separate data streams for spatial multiple-input multiple-output testing and/or to process the same data streams for radio resource management testing.

9. The measurement system according to claim 1, wherein the antennas are dual-polarized antennas.

10. A method for testing a device under test placed on a test location by using a measurement system comprising a signal generation and/or analysis equipment and two integrated beam path adjustment units, each including an antenna and a reflector coupled with the respective antenna, wherein the linear adjustment members of both beam path adjustment units intersect each other at an axis in the area of the test location at which the device under test is positioned during testing, with the following steps:

adjusting the beam path adjustment unit with respect to the device under test so that a beam path is established between the device under test and the respective antenna of the beam path adjustment unit having a defined angular orientation, wherein the antenna of the integrated beam path adjustment unit is displaced along a linear rail in a linear manner with respect to the reflector when the beam path adjustment unit is adjusted, wherein the reflector is also mounted on the respective linear rail;

moving both beam path adjustment units about the same axis independently from each other, thereby adjusting the angular orientations;

generating an electromagnetic signal by the device under test and/or the signal generation equipment; and receiving the electromagnetic signal generated via the signal analysis equipment and/or the device under test, and wherein multiple-input multiple-output (MIMO) and radio resource management (RRM) measurements are performed by using the measurement system, and wherein MIMO and RRM characteristics of the device under test are tested since two different base stations are simulated for testing hand-over scenarios.

11. The method according to claim 10, wherein the measurement system includes at least two antennas, at least two reflectors, a signal generation and/or analysis equipment, and a test location for the device under test, wherein each of the at least two antennas is assigned to a corresponding reflector, wherein each of the at least two antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein the beam paths have different angular orientations that are adjustable, and wherein at least one antenna and the corresponding reflector are coupled with each other so that an integrated beam path adjustment unit is established including at least one antenna and the corresponding reflector.

12. A measurement system for testing a device under test, comprising:

a shielded space, at least two antennas, at least two reflectors, a signal generation and/or analysis equipment, and a test location for the device under test, wherein each of the at least two antennas is assigned to a corresponding reflector, wherein each of the at least two antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein the beam paths have different angular orientations that are adjustable, wherein at least one antenna and the corresponding reflector are coupled with each other so that an integrated beam path adjustment unit is established including the at least one antenna and the corresponding reflector such that the measurement system comprises two integrated beam path adjustment units, and wherein each of the integrated beam path adjustment unit comprises linear adjustment member that is capable of adjusting the linear position of the reflector and the linear position of the antenna of the respective integrated beam path adjustment unit, thereby adjusting the angular orientation of the respective beam path, and wherein the linear adjustment member is established by a linear rail that is attached to a wall of the shielded space, such that the antenna and the corresponding reflector are attached to a wall of the shielded space, wherein the antenna and the corresponding reflector of each respective integrated beam path adjustment unit are attached to the same wall of the shielded space, and wherein the reflector is displaceable along a connecting member via which the antenna is connected to the linear adjustment member.

* * * * *